(12) United States Patent
Okumura

(10) Patent No.: US 10,164,021 B2
(45) Date of Patent: Dec. 25, 2018

(54) SILICON CARBIDE SEMICONDUCTOR DEVICE

(71) Applicant: Fuji Electric Co., Ltd., Kanagawa (JP)

(72) Inventor: Keiji Okumura, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/947,546

(22) Filed: Apr. 6, 2018

(65) Prior Publication Data

US 2018/0342587 A1 Nov. 29, 2018

(30) Foreign Application Priority Data

May 26, 2017 (JP) .................................. 2017-104756

(51) Int. Cl.
| | |
|---|---|
| *H01L 29/16* | (2006.01) |
| *H01L 29/10* | (2006.01) |
| *H01L 29/78* | (2006.01) |
| *H01L 29/66* | (2006.01) |

(52) U.S. Cl.
CPC ...... *H01L 29/1608* (2013.01); *H01L 29/1095* (2013.01); *H01L 29/66068* (2013.01); *H01L 29/7813* (2013.01)

(58) Field of Classification Search
CPC ............. H01L 29/1608; H01L 29/1095; H01L 29/66068; H01L 29/7813
USPC ........................................... 257/77; 438/197
See application file for complete search history.

(56) References Cited

U.S. PATENT DOCUMENTS

| | | | |
|---|---|---|---|
| 5,742,076 A * | 4/1998 | Sridevan | H01L 21/049 257/77 |
| 6,054,752 A * | 4/2000 | Hara | H01L 29/0611 257/629 |
| 2007/0007537 A1* | 1/2007 | Ogura | H01L 29/7828 257/77 |
| 2010/0224886 A1* | 9/2010 | Iwamuro | H01L 29/41741 257/77 |
| 2013/0092978 A1* | 4/2013 | Sugawara | H01L 29/7395 257/139 |
| 2016/0190307 A1* | 6/2016 | Kagawa | H01L 29/66068 257/77 |
| 2018/0033885 A1* | 2/2018 | Okumura | H01L 21/02378 |

(Continued)

FOREIGN PATENT DOCUMENTS

JP 4738562 B2 8/2011

*Primary Examiner* — Jami Valentine Miller
(74) *Attorney, Agent, or Firm* — Chen Yoshimura LLP

(57) ABSTRACT

A silicon carbide semiconductor device includes an n-type drift region made of SiC, n-type base regions, gate electrodes formed inside trenches with gate insulating films interposed therebetween, n-type source regions formed in upper portions of the base regions, an n-type drain region formed on the bottom of the drift region, p-type protection regions formed beneath the trenches, and p-type avalanche breakdown-inducing regions (first under-contact base regions) formed at the same depth as the protection regions and having the same impurity concentration as the protection regions. The width $w_{cb}$ of the avalanche breakdown-inducing regions and the width $w_{tb}$ of the protection regions satisfy the relationship $w_{tb}/w_{cb} > 4/3$.

12 Claims, 13 Drawing Sheets

(56) References Cited

U.S. PATENT DOCUMENTS

2018/0061934 A1* 3/2018 Ueno ................... H01L 21/046
2018/0158946 A1* 6/2018 Koga .................. H01L 29/7813
2018/0182884 A1* 6/2018 Kobayashi .......... H01L 29/7806

* cited by examiner

| No. | 1 | 2 | 3 | 4 | 5 | 6 | 7 | 8 | 9 | 10 | 11 |
|---|---|---|---|---|---|---|---|---|---|---|---|
| Cell pitch ($w_{CELL}$) [μm] | 3.07 | 3.24 | 3.41 | 3.58 | 3.75 | 3.92 | 4.09 | 4.26 | 4.43 | 4.6 | 4.77 |
| JFET width ($w_{JFET}$) [μm] | 0.77 | 0.77 | 0.77 | 0.77 | 0.77 | 0.77 | 0.77 | 0.77 | 0.77 | 0.77 | 0.77 |
| Width of protection region beneath trench ($w_{tb}$) [μm] | 1.36 | 1.36 | 1.36 | 1.36 | 1.36 | 1.36 | 1.36 | 1.36 | 1.36 | 1.36 | 1.36 |
| Width of under-contact base region ($w_{cb}$) [μm] | 0.17 | 0.34 | 0.51 | 0.68 | 0.85 | 1.02 | 1.19 | 1.36 | 1.53 | 1.70 | 1.87 |
| Width difference ($w_{tb} - w_{cb}$) [μm] | 1.19 | 1.02 | 0.88 | 0.71 | 0.54 | 0.37 | 0.2 | 0.03 | -0.14 | -0.31 | -0.48 |
| Width ratio ($\frac{w_{tb}}{w_{cb}}$) | 8 | 4 | 2.67 | 2 | 1.6 | $\frac{4}{3}$ | 1.14 | 1 | 0.89 | 0.80 | 0.73 |
| Occurrence of avalanche current — Protection region beneath trench | No | No | No | No | No | Yes *Minor | Yes *Minor | Yes | Yes | Yes | Yes |
| Occurrence of avalanche current — Under-contact base region | Yes | Yes | Yes | Yes | Yes | Yes | Yes | Yes | No | No | No |

FIG. 2

SILICON CARBIDE SEMICONDUCTOR DEVICE

BACKGROUND OF THE INVENTION

Technical Field

The present invention relates to a silicon carbide (SiC) semiconductor device.

Background Art

In trench MOSFETs and the like that use a silicon carbide semiconductor, if a reverse bias voltage is applied when the device is off (hereinafter, also referred to simply as "at OFF time"), a high voltage is applied between the drain and the source. This high voltage sometimes causes avalanche breakdown to occur beneath the trench, in which case the resulting avalanche current can cause the gate insulating film formed inside the trench to break down, particularly in portions of the film at the bottom of the trench.

In order to protect the gate insulating film, Patent Document 1, for example, discloses a technology in which an electric field shielding region for reducing the strength of the electric field applied to the gate insulating film is formed beneath the trench. However, Patent Document 1 only describes the simple concept of separately forming such an electric field shielding region beneath the trench and does not provide any detailed examination of application of the technology to the design of a more concrete semiconductor device. Therefore, this technology may not actually make it possible to reliably protect the gate insulating film.

RELATED ART DOCUMENTS

Patent Documents

Patent Document 1: Japanese Patent No. 4738562

SUMMARY OF THE INVENTION

More particularly, Patent Document 1 discloses not only forming the electric field shielding region beneath the trench but also forming, beneath a base region between adjacent trenches, a p-type electric field shielding region of the same conductivity type as the base region and the electric field shielding region beneath the trench. Research performed by the present inventor revealed that when an electric field shielding region beneath the trench and an electric field shielding region beneath the base region are both present, there are cases in which, depending on specifications such as the widths, impurity concentrations (concentrations), and depths of the respective regions, it is not possible to sufficiently avoid the flow of avalanche current into the bottom of the trench.

The present invention was made in view of the problems described above and aims to provide a silicon carbide semiconductor device which makes it possible to avoid the flow of avalanche current into the bottom of the trench and to thereby reliably prevent breakdown of the gate insulating film.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a silicon carbide semiconductor device, including: a drift region made of silicon carbide of a first conductivity type; a base region made of silicon carbide of a second conductivity type, formed above the drift region; a first contact semiconductor region made of silicon carbide of the first conductivity type formed in an upper portion of the base region; a second contact semiconductor region made of silicon carbide of the first conductivity type formed on a bottom of the drift region; a trench gate structure having a trench penetrating the first contact semiconductor region and the base region and extending towards the drift region, the trench gate structure further having a gate insulating film formed inside the trench and a gate electrode filling in the trench with the gate insulating film interposed therebetween; a protection region made of silicon carbide of the second conductivity type formed adjacent to and beneath a bottom of the trench; and an avalanche breakdown-inducing region made of silicon carbide of the second conductivity type that is formed beneath the base region at a same depth as the protection region and has a same impurity concentration as the protection region, wherein a width $w_{cb}$ of the avalanche breakdown-inducing region and a width $w_{tb}$ of the protection region satisfy $w_{tb}/w_{cb} > 4/3$.

In another aspect, the present disclosure provides a silicon carbide semiconductor device, including: a drift region made of silicon carbide of a first conductivity type; a base region made of silicon carbide of a second conductivity type, formed above the drift region; a first contact semiconductor region made of silicon carbide of the first conductivity type formed in an upper portion of the base region; a second contact semiconductor region made of silicon carbide of the first conductivity type formed on a bottom of the drift region; a trench gate structure having a trench penetrating the first contact semiconductor region and the base region and extending towards the drift region, the trench gate structure further having a gate insulating film formed inside the trench and a gate electrode filling in the trench with the gate insulating film interposed therebetween; a protection region made of silicon carbide of the second conductivity type formed adjacent to and beneath a bottom of the trench; and an avalanche breakdown-inducing region made of silicon carbide of the second conductivity type that is formed beneath the base region at a same depth as the protection region and has a same impurity concentration as the protection region, wherein a width $w_{cb}$ of the avalanche breakdown-inducing region and a width $w_{tb}$ of the protection region satisfy $w_{tb} - 0.4 \: \mu m > w_{cb}$.

The silicon carbide semiconductor device according to the present invention makes it possible to avoid the flow of avalanche current into the bottom of the trench and to thereby prevent breakdown of the gate insulating film It is to be understood that both the foregoing general description and the following detailed description are exemplary and explanatory, and are intended to provide further explanation of the invention as claimed.

BRIEF DESCRIPTION OF THE DRAWINGS

FIG. 2 is a table showing the results of an examination of locations where avalanche breakdown occurs for different widths $w_{cb}$ of an avalanche breakdown-inducing region.

DETAILED DESCRIPTION OF EMBODIMENTS

Figure 1:
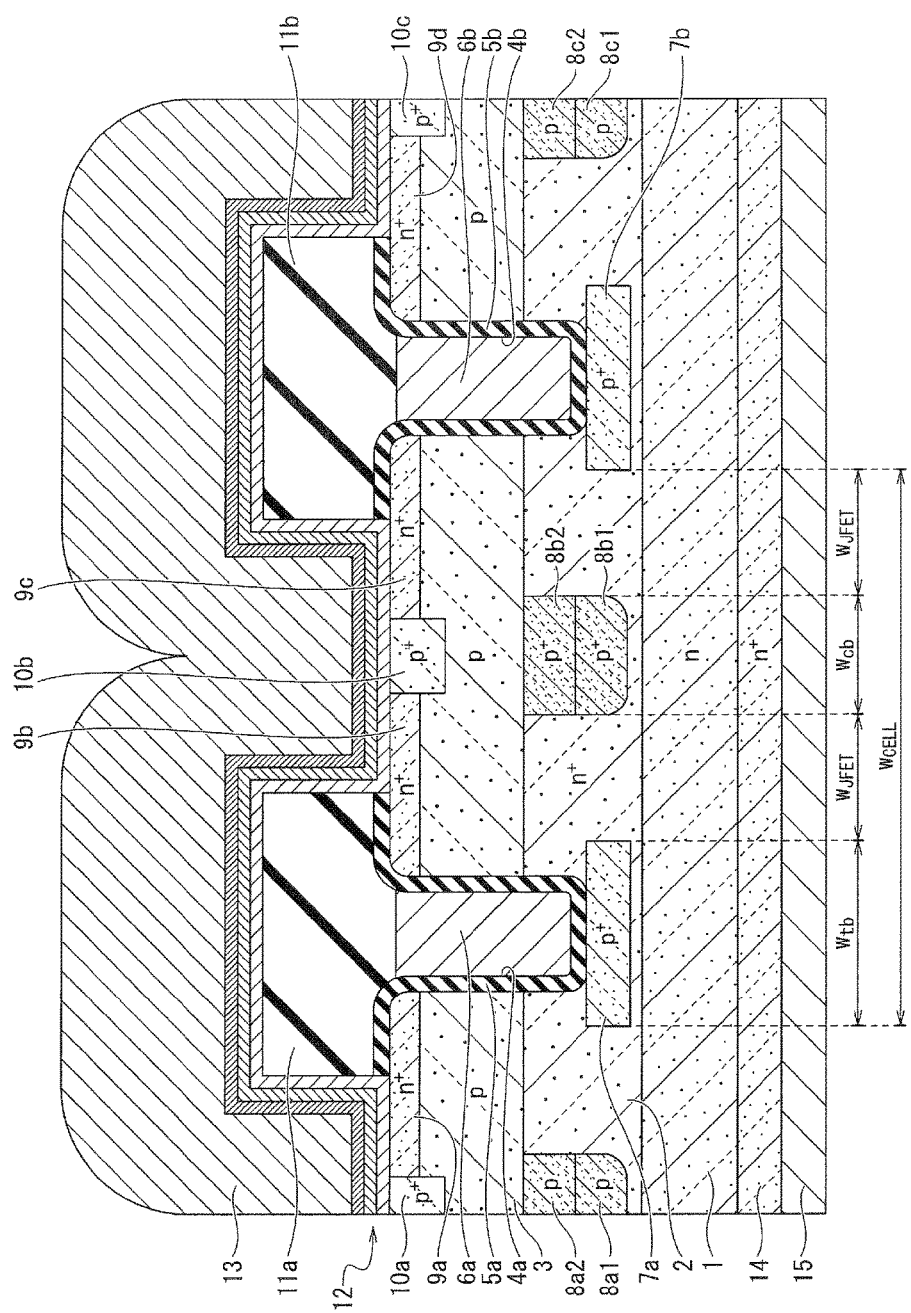
FIG. 1 is a cross-sectional view schematically illustrating a basic configuration of an SiC semiconductor device according to an embodiment of the present invention.

Next, an embodiment of the present invention will be described. In the following descriptions of the figures, the same or similar reference characters are used for components that are the same or similar. Note, however, that the figures are only intended to be schematic illustrations, and the relationships between thickness and planar dimensions, the ratios between the thicknesses of each device and each component, and the like may be different from in the actual devices. Therefore, specific thicknesses and dimensions should be determined by referring to the descriptions below. Similarly, the illustrated dimensional relationships and ratios of components in the figures may differ from one figure to the next.

Moreover, in the following descriptions, the "left and right" and the "up and down" directions are defined only for the purposes of convenience and do not limit the technical concepts of the present invention in any way. Therefore, the figures may be rotated by 90° such that the "left and right" and the "up and down" directions are interchanged, or the figures may be rotated by 180° such that the "left" direction becomes the "right" direction and the "right" direction becomes the "left" direction, for example. Furthermore, although the following descriptions assume that the "first conductivity type" is n-type and that the "second conductivity type" is p-type as an example, the conductivity types may be selected in the opposite manner such that the first conductivity type is p-type and the second conductivity type is n-type. In addition, the symbols + and − are appended to the letters n and p to indicate that the corresponding semiconductor region has a higher or lower impurity concentration, respectively, than a semiconductor region for which the symbols + and − are not appended to the letters n and p.

Moreover, in the present specification, the term "first main electrode region" or "first contact semiconductor region" refers to one of the source semiconductor region and the drain semiconductor region in a field-effect transistor (FET) or a static induction transistor (SIT) with high impurity concentrations for contact to the source electrode or drain electrode. In an insulated-gate bipolar transistor (IGBT), this term refers to one of the emitter semiconductor region and the collector semiconductor region to contact the emitter electrode or collector electrode. Furthermore, the term "second main electrode region" refers, in a FET or a SIT, to the one semiconductor region among the source region and the drain region that is not the first main electrode region, and, in an IGBT, to the one region among the emitter region and the collector region that is not the first main electrode region.

<Semiconductor Device>

As illustrated in FIG. 1, an SiC semiconductor device according to the embodiment of the present invention is a MOSFET including an n⁻ drift region 1 constituted by an SiC semiconductor substrate and an n-type charge accumulation layer 2 formed on the drift region 1 and having a higher impurity concentration than the drift region 1. The drift region 1 can be formed as an epitaxial layer with a thickness of approximately 2.5 m and an impurity element concentration of approximately $3.0 \times 10^{15}$ cm⁻³, for example. The charge accumulation layer 2 has a thickness of approximately 1.2 m and an impurity element concentration of approximately $1.0 \times 10^{17}$ cm⁻³, for example, and can be formed by ion-implanting an n-type impurity element such as nitrogen (N) into the upper portion of the epitaxial layer forming the drift region 1.

A p-type base regions 3 are formed on the charge accumulation layer 2. The base regions 3 can be formed as an epitaxial layer with a thickness of approximately 1.3 m and an impurity element concentration of approximately $4.0 \times 10^{17}$ cm⁻³, for example. Moreover, as illustrated in FIG. 1, trenches 4a and 4b are formed extending from the top of the base regions 3 to the charge accumulation layer 2 in the vertical direction towards the drift region 1.

The illustration of the SiC semiconductor device in FIG. 1 focuses on the two trenches 4a and 4b and the regions surrounding these trenches 4a and 4b in the device. In reality, a plurality of other trenches are formed around the trenches 4a and 4b, and these trenches extend parallel to one another in the direction perpendicular to the page of FIG. 1, with gaps left therebetween. The SiC semiconductor device according to the embodiment of the present invention is an integrated 6-inch power semiconductor device in which the structure illustrated in FIG. 1 is repeatedly formed on both the left and right sides of FIG. 1.

The SiC semiconductor device illustrated in FIG. 1 further includes gate insulating films 5a and 5b respectively formed in the trenches 4a and 4b, as well as gate electrodes 6a and 6b respectively formed in the trenches with the gate insulating films 5a and 5b interposed therebetween. Interlayer insulating films 11a and 11b are respectively formed on the surfaces of the gate electrodes 6a and 6b. Beneath the plurality of trenches 4a and 4b, p-type protection regions 7a and 7b for protecting the gate insulating films 5a and 5b at OFF time are respectively formed, with the upper surfaces of these regions contacting the bottoms of the trenches 4a and 4b.

In the upper portions of the plurality of base regions 3, a plurality of p⁺ base contact regions 10a to 10c are formed between the adjacent trenches 4a and 4b. Moreover, directly beneath the base regions 3 positioned beneath the base contact regions 10a to 10c, first under-contact base regions 8a1, 8b1 and 8c1 and second under-contact base regions 8a2, 8b2 and 8c2 (which are all p-type) are formed in a layered manner in that order from bottom to top.

The first under-contact base regions 8a1, 8b1 and 8c1 and the second under-contact base regions 8a2, 8b2 and 8c2 have a rectangular cross-sectional shape and extend within the charge accumulation layer 2 in a parallel manner to the trenches 4a and 4b extending in the direction perpendicular to the page of FIG. 1. The first under-contact base regions 8a1, 8b1 and 8c1 can be formed to a desired depth and widths in the charge accumulation layer 2 by performing a selective ion implantation using a p-type impurity element such as aluminum (Al) while controlling the acceleration voltage, for example. In the SiC semiconductor device illustrated in FIG. 1, the first under-contact base regions 8a1, 8b1 and 8c1 are formed in the charge accumulation layer 2 such that the bottom surfaces of these regions are positioned above the bottom surface of the charge accumulation layer 2 with a separation of approximately 0.2 am therebetween.

The second under-contact base regions 8a2, 8b2 and 8c2 can be formed in the upper portion of the charge accumulation layer 2 by performing a selective ion implantation process with the acceleration voltage set to lower than when forming the first under-contact base regions 8a1, 8b1 and 8c1. The first under-contact base regions 8a1, 8b1 and 8c1 and the second under-contact base regions 8a2, 8b2 and 8c2 have substantially the same thickness and also have substantially the same width in the left-to-right direction. The first under-contact base regions 8a1, 8b1 and 8c1 are formed at substantially the same depth as the protection regions 7a and 7b beneath the trenches 4a and 4b and correspond to "avalanche breakdown-inducing regions" in the present invention.

The SiC semiconductor device illustrated in FIG. 1 further includes a plurality of $n^+$ source regions 9a to 9d selectively formed in the upper portions of the base regions 3, and a source electrode 13 formed on the source regions 9a to 9d with a barrier metal layer 12 interposed therebetween. The source regions 9a to 9d have a thickness of approximately 0.3 μm and an impurity element concentration of approximately $3.0 \times 10^{20}$ cm$^{-3}$, for example, and can be formed by ion-implanting an n-type impurity element.

The base contact regions 10a to 10c have a thickness of approximately 0.5 jam, a width of approximately 1.0 jam in the left-to-right direction in FIG. 1, and an impurity element concentration of approximately $3.0 \times 10^{20}$ cm$^{-3}$, for example, and can be formed by ion-implanting a p-type impurity element. The thickness of the base regions 3 between the base contact regions 10a to 10c and the second under-contact base regions 8a2, 8b2 and 8c2 is approximately 0.5 μm. The source regions 9a to 9d are connected to the source electrode 13 and correspond to "first main electrode regions" in the present invention.

The barrier metal layer 12 has a three-layer structure formed spanning across the respective upper surfaces of the interlayer insulating films 11a and 11b, the source regions 9a to 9d, and the base contact regions 10a to 10c above the drift region 1 and inhibits growth of silicon (Si) nodules. The thickness of the barrier metal layer 12 is approximately 0.5 μm. As illustrated in FIG. 1, the barrier metal layer 12 has a cross-sectional shape including protrusions and recesses. The length of the bottom portions sandwiched between the left and right sidewalls of the recesses is approximately 3.0 μm, and the base contact regions 10a to 10c are formed contacting the lower surfaces of regions positioned substantially at the center of these bottom portions.

A passivation film or the like is deposited on the upper surface of the source electrode 13 as an uppermost layer, and openings are formed in the passivation film or the like to expose portions of the principal surface of the underlying source electrode 13. The exposed portions of principal surface of the source electrode 13 can be used as source bonding pads. Similarly, other openings are formed in the passivation film or the like at locations other than over the source electrode 13 to expose a wiring layer which is connected to the gate electrodes 6a and 6b. The exposed wiring layer portion can be used as a gate bonding pad. Note that the passivation film, the bonding pads, and the like are not illustrated in the figure.

The SiC semiconductor device illustrated in FIG. 1 further includes an $n^+$ drain region 14 formed in a layered manner on the bottom of the drift region 1 and a drain electrode 15 formed underneath the drain region 14 and connected to the drain region 14. The drain region 14 corresponds to a "second main electrode region" in the present invention.

The protection regions 7a and 7b of the embodiment of the present invention have a rectangular cross-sectional shape and extend parallel to the trenches 4a and 4b in a manner similar to the first under-contact base regions 8a1, 8b1 and 8c1 and the second under-contact base regions 8a2, 8b2 and 8c2. The protection regions 7a and 7b and the first under-contact base regions 8a1, 8b1 and 8c1 all have substantially the same thickness of approximately 0.5 jam, and the bottom surfaces of the first under-contact base regions 8a1, 8b1 and 8c1 and the bottom surfaces of the protection regions 7a and 7b are aligned at the same height. The protection regions 7a and 7b are formed by ion-implanting a p-type impurity element to achieve an impurity element concentration of approximately $5.0 \times 10^{18}$ cm$^{-3}$, for example.

As illustrated in FIG. 1, the cross-sectional shape of the first under-contact base regions 8a1, 8b1 and 8c1 is smoothly curved such that the lower edges on the left and right sides all have lower curvature than the lower edges on both sides of the respective protection regions 7a and 7b. Conversely, the cross-sectional shape of the protection regions 7a and 7b is formed such that the lower edges on the left and right sides all come to a sharper angle than in the first under-contact base regions 8a1, 8b1 and 8c1. As shown in the figure, by forming the regions narrower, the respective lower edges become smoother resulting in a smaller curvature, and by forming the regions wider, the respective lower edges become steeper resulting in a larger curvature. The impurity concentrations of the first under-contact base regions 8a1, 8b1 and 8c1 and the second under-contact base regions 8a2, 8b2 and 8c2 are set to be substantially equal to that of the protection regions 7a and 7b, at approximately $5.0 \times 10^{18}$ cm$^{-3}$.

A pitch $w_{CELL}$ of one cell in the SiC semiconductor device illustrated in FIG. 1 includes a width $w_{tb}$ of one protection region 7a and a width $w_{cb}$ of one first under-contact base region 8b1 adjacent to this protection region 7a. The cell pitch $w_{CELL}$ also includes two JFET widths $w_{JFET}$ of junction gate field-effect transistor (JFET) regions respectively positioned on the left and right sides of the first under-contact base region 8b1. In other words, $$w_{CELL} = w_{tb} + w_{cb} + 2 \times w_{JFET}.$$

Note that in the present specification, the width $w_{tb}$ of the protection regions 7a and 7b and the width $w_{cb}$ of the first under-contact base regions 8a1, 8b1 and 8c1 refer to the maximum widths of the respective regions as measured in the left-to-right direction in FIG. 1. Moreover, the JFET width $w_{JFET}$ refers to the minimum width between the protection regions 7a and 7b and the first under-contact base regions 8a1, 8b1 and 8c1.

Furthermore, in the SiC semiconductor device according to the embodiment of the present invention, the width $w_{cb}$ of the first under-contact base regions 8a1, 8b1 and 8c1 and the width $w_{tb}$ of the protection regions 7a and 7b under the trenches 4a and 4b are set so as to satisfy the following relationship.

$$\frac{w_{tb}}{w_{cb}} > \frac{4}{3} \qquad \text{<Formula 1>}$$

In other words, the width $w_{cb}$ of the first under-contact base regions 8a1, 8b1 and 8c1 is shortened so as to be less than ¾ of the width $w_{tb}$ of the protection regions 7a and 7b under the trenches 4a and 4b. Maintaining the relationship given by formula (1) between the width $w_{tb}$ and the width $w_{cb}$ ensures that if a high voltage is applied between the drain and the source due to a reverse bias at OFF time, the first under-contact base region 8a1, 8b1 and 8c1 sides reach the avalanche voltage before the trench 4a and 4b sides. As a result, avalanche breakdown occurs beneath the first under-contact base regions 8a1, 8b1 and 8c1, thereby making it possible to avoid the flow of avalanche current into the bottom sides of the trenches 4a and 4b. This, in turn, prevents breakdown of the gate insulating films 5a and 5b at the bottoms of the trenches 4a and 4b and thereby makes it possible to avoid any significant effects on the quality of the semiconductor device.

Next, a simulation experiment performed by the present inventor in order to examine occurrence of avalanche current for different widths $w_{cb}$ of the first under-contact base regions 8a1, 8b1 and 8c1 will be described with reference to FIG. 2. First, a JFET width $w_{JFET}$ of approximately 0.77 m and a width $w_{tb}$ of approximately 1.36 m for the protection regions 7a and 7b were respectively set as constants. Then, 11 configurations No. 1 to No. 11 in which the width $w_{cb}$ of the first under-contact base region 8b1 was increased in 0.17 μm increments from approximately 0.17 μm in No. 1 to approximately 1.87 m in No. 11 were examined.

In No. 1 to No. 7, the width $w_{cb}$ of the first under-contact base region 8b1 was less than the width $w_{tb}$ of the protection region 7a beneath the trench 4a, while in No. 8 these widths were equal. Moreover, in No. 9 to No. 11, the width $w_{cb}$ of the first under-contact base region 8b1 was greater than the width $w_{tb}$ of the protection region 7a beneath the trench 4a. In other words, the width difference ($w_{tb}-w_{cb}$) decreases going from No. 1 to No. 11. As the width $w_{cb}$ of the first under-contact base region 8b1 increases, the cell pitch $w_{CELL}$ including that width $w_{cb}$ also increases.

FIGS. 2 to 13 respectively illustrate the internal current distributions obtained in SiC semiconductor devices respectively having configurations No. 1 to No. 11 upon respectively applying high voltages corresponding to the voltages that would be applied as a result of reverse bias at OFF time. In these figures, the regions with no hatching have a current of zero, and denser hatching indicates that current of greater magnitude is flowing.

Each figure shows a partial region extending from the center position of the protection region 7a beneath the trench 4a to the center position of the first under-contact base region 8b1 as illustrated in FIG. 1 (in other words, a region corresponding to one half of one cell pitch $w_{CELL}$). Positions J corresponding to p-n junctions at the boundaries between p-type semiconductor regions and n-type semiconductor regions are indicated by bold lines, and positions d corresponding to the edges of depletion layers that form when a voltage is applied are indicated by white-filled lines.

Figure 3:
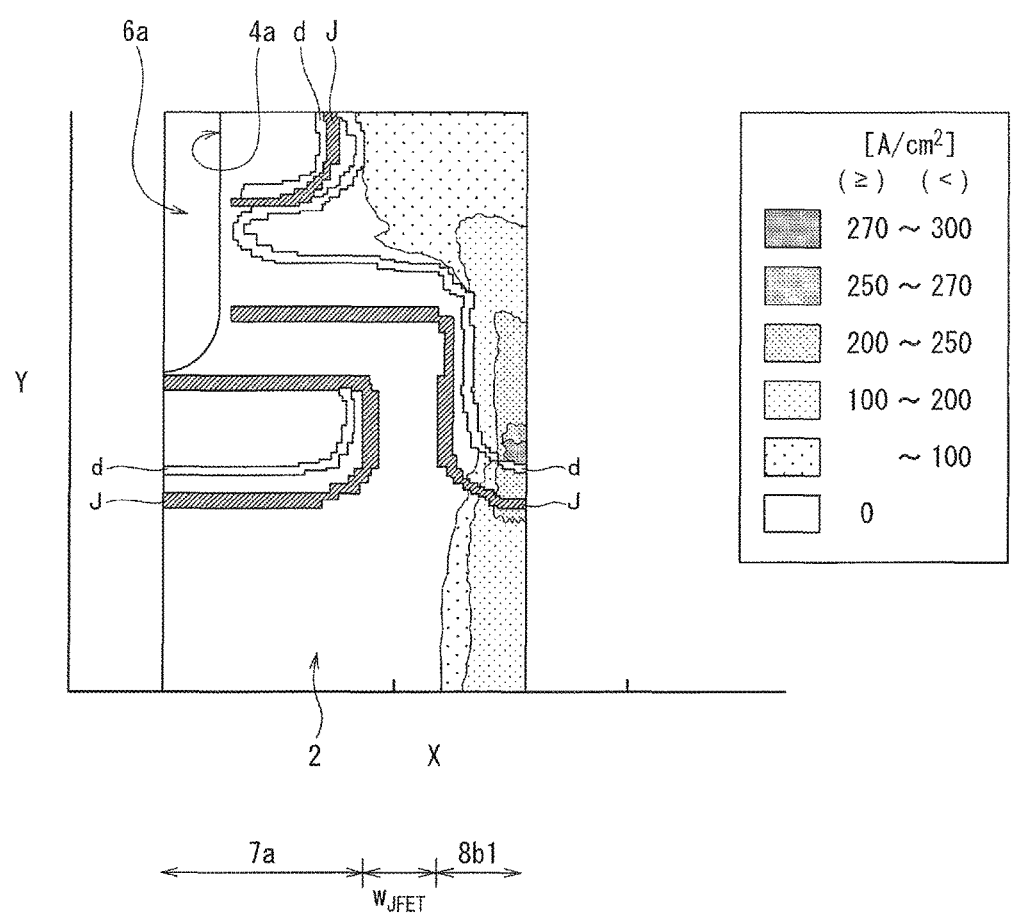
FIG. 3 schematically illustrates current distribution within the SiC semiconductor device in case No. 1 in FIG. 2.

First, as illustrated in FIG. 3, in configuration No. 1 the width $w_{cb}$ of the first under-contact base region 8b1 is the smallest relative to the width $w_{tb}$ of the protection region 7a beneath the trench 4a among the 11 configurations, and the width ratio ($w_{tb}/w_{cb}$) is 8. In No. 1, an extremely large current flows through the regions above and below the first under-contact base region 8b1, and no current whatsoever flows beneath the trench 4a.

Figure 4:
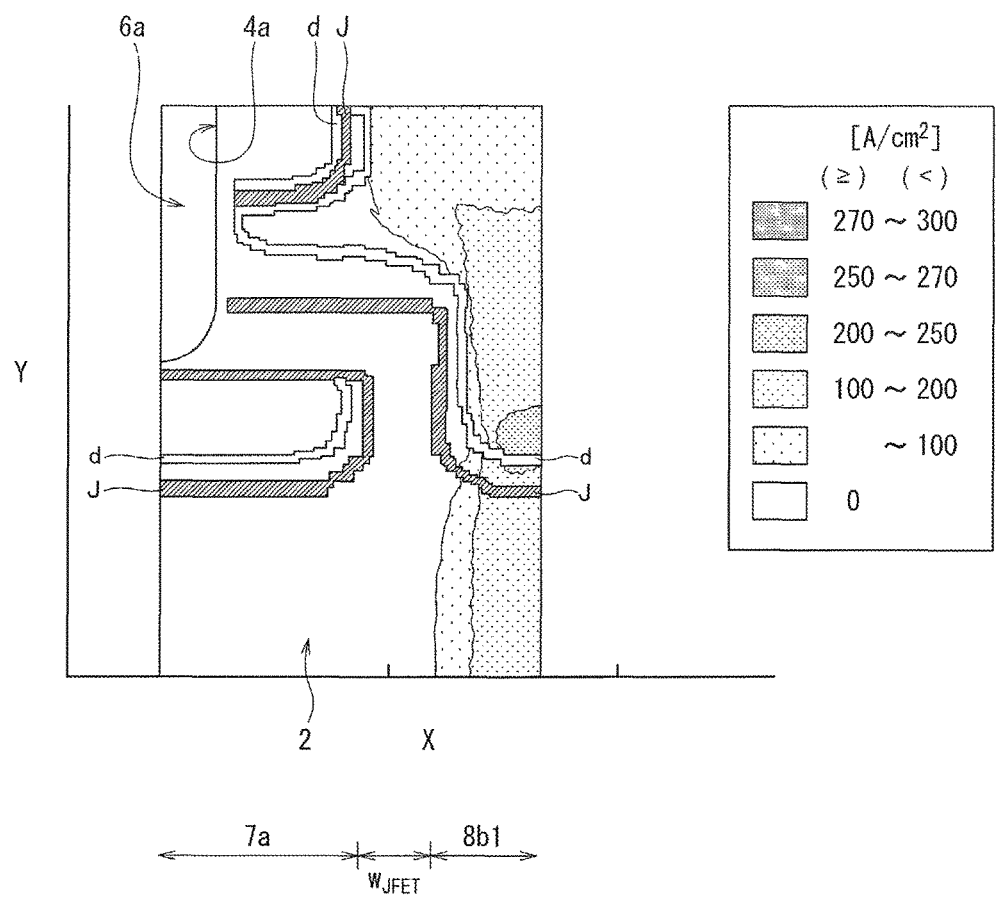
FIG. 4 schematically illustrates current distribution within the SiC semiconductor device in case No. 2 in FIG. 2.
Figure 5:
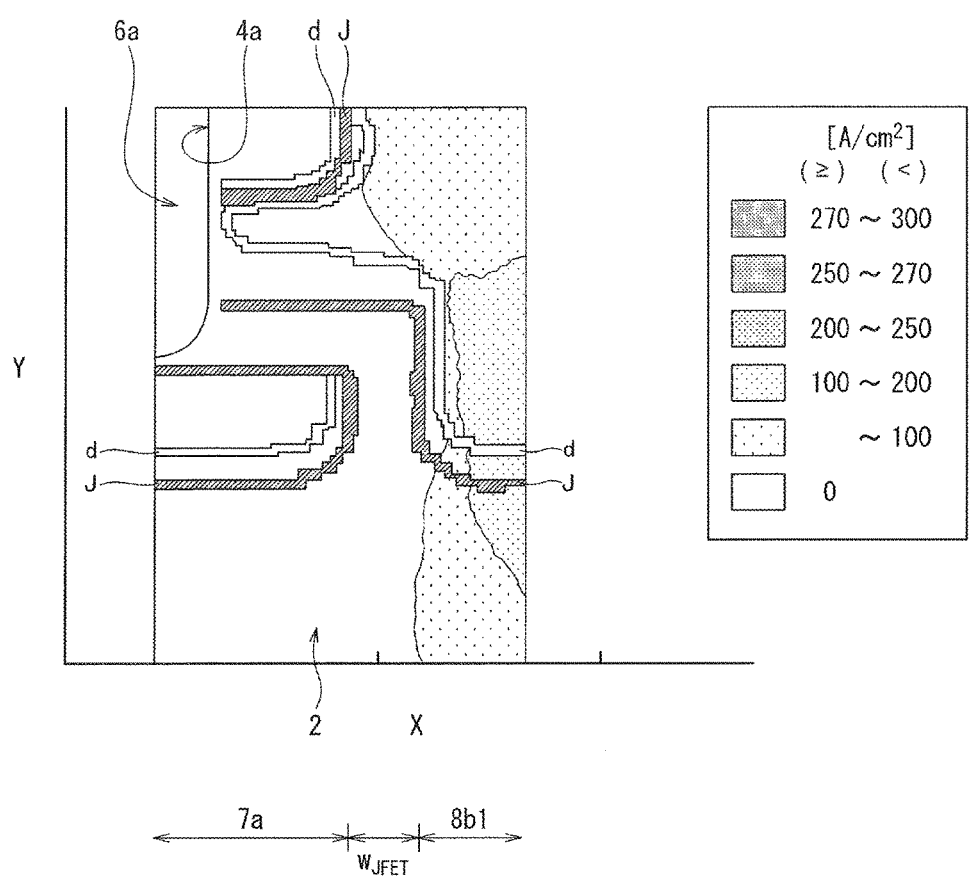
FIG. 5 schematically illustrates current distribution within the SiC semiconductor device in case No. 3 in FIG. 2.
Figure 6:
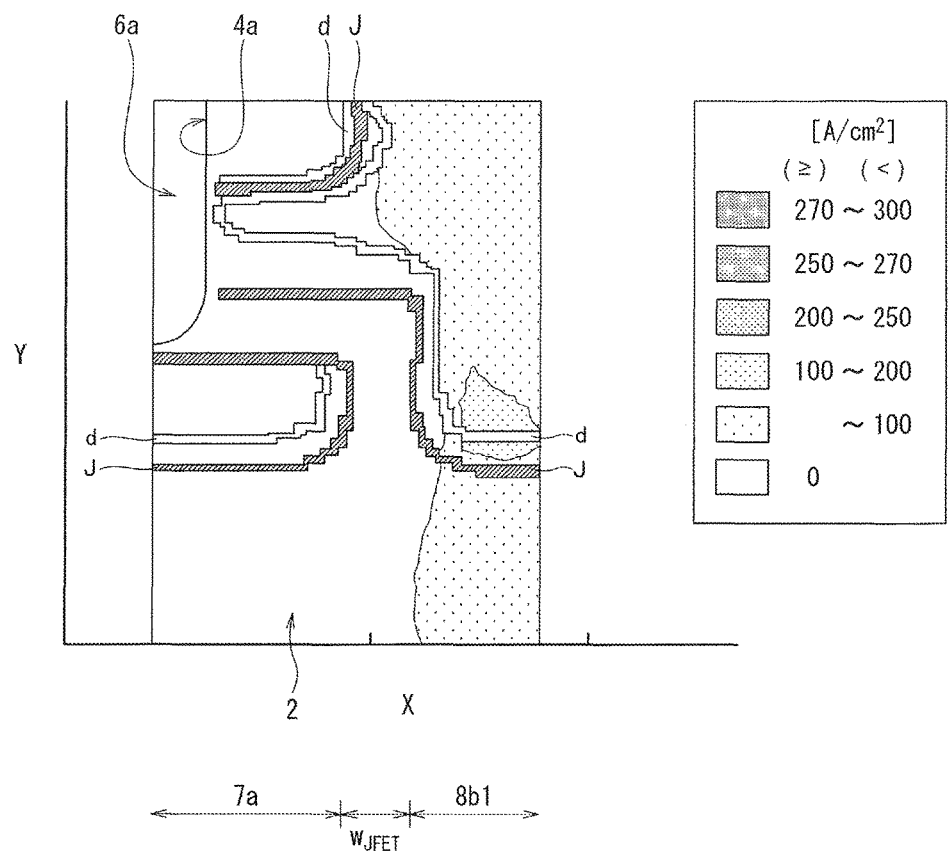
FIG. 6 schematically illustrates current distribution within the SiC semiconductor device in case No. 4 in FIG. 2.

Next, as illustrated in FIG. 4, in No. 2 the width ratio ($w_{tb}/w_{cb}$) is 4, and although the width $w_{cb}$ of the first under-contact base region 8b1 is not quite so small relative to the width $w_{tb}$ of the protection region 7a, there is still no current whatsoever flowing beneath the trench 4a. Similarly, as illustrated in FIGS. 5 and 6, even though the width ratio ($w_{tb}/w_{cb}$) is even smaller in No. 3 and No. 4, a certain amount of current flows beneath the first under-contact base region 8b1, and once again there is still no current whatsoever flowing beneath the trench 4a.

Figure 7:
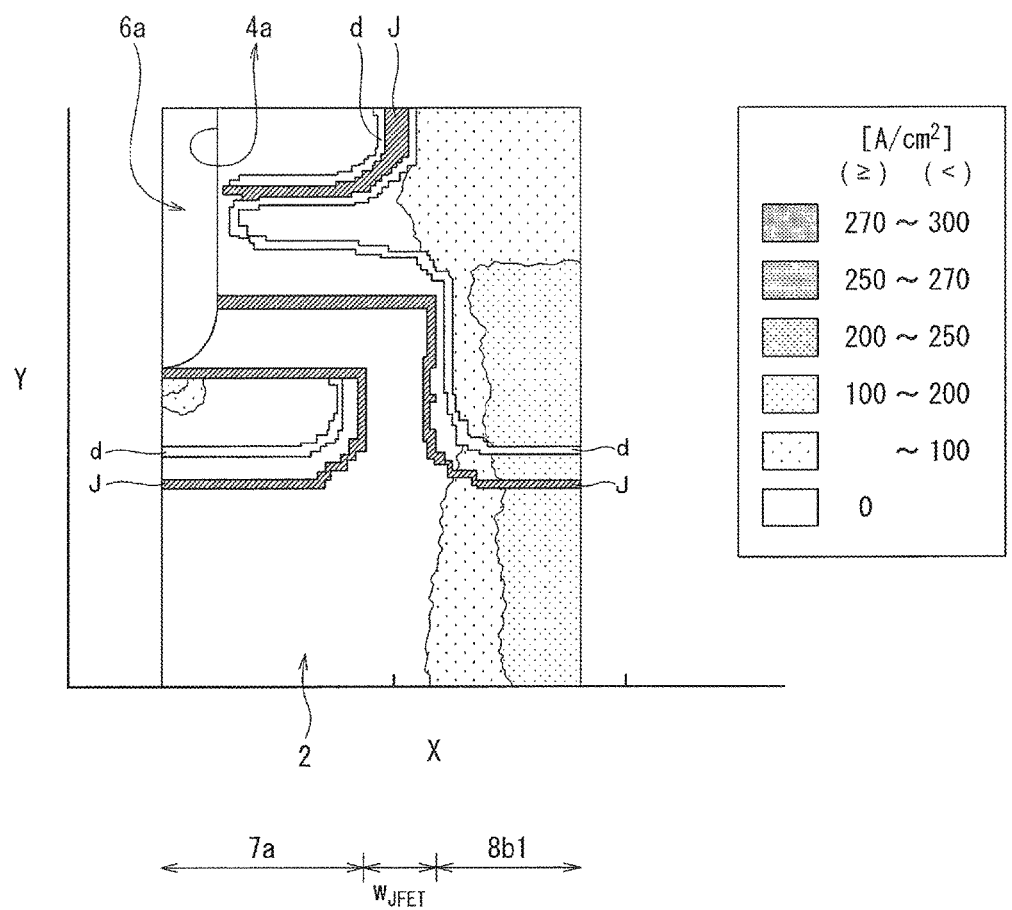
FIG. 7 schematically illustrates current distribution within the SiC semiconductor device in case No. 5 in FIG. 2.

Furthermore, as illustrated in FIG. 7, once the width ratio ($w_{tb}/w_{cb}$) was reduced to 1.6 in No. 5, a very small current was observed beneath the trench 4a. However, the region in which current was observed was extremely localized in the upper portion of the protection region 7a, and the magnitude of this current also remained extremely small, which suggests that there would be substantially no effects on the gate insulating film 5a and that this configuration would be substantially free of problems.

Figure 8:
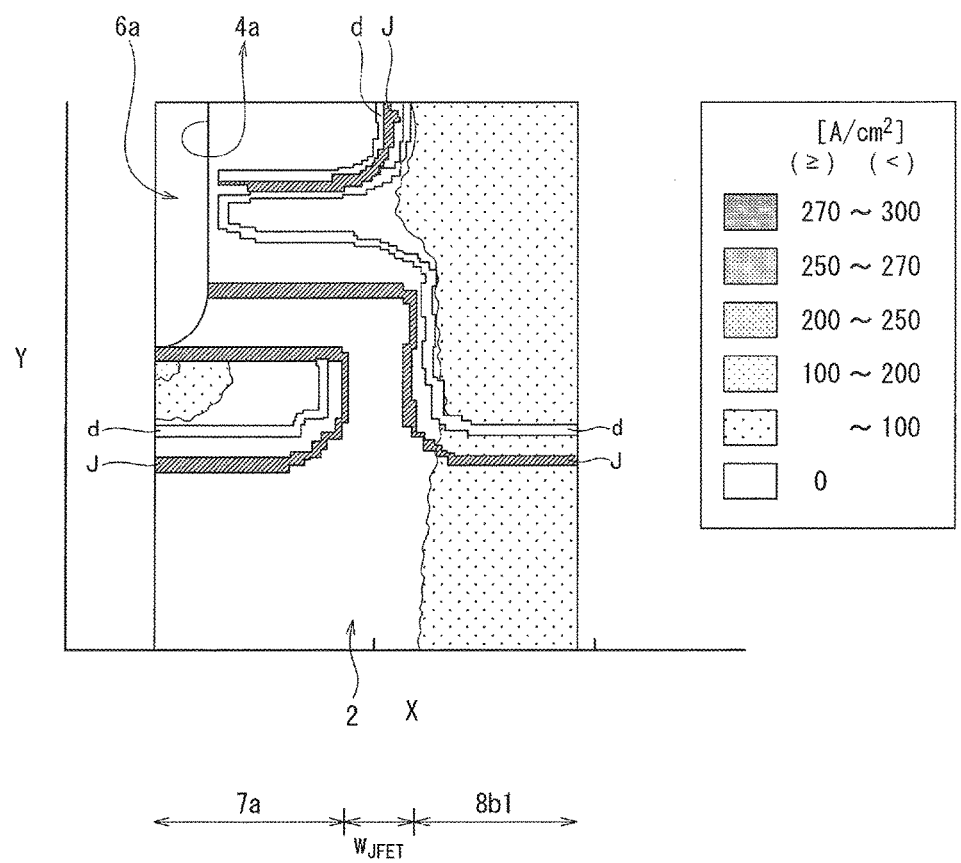
FIG. 8 schematically illustrates current distribution within the SiC semiconductor device in case No. 6 in FIG. 2.
Figure 9:
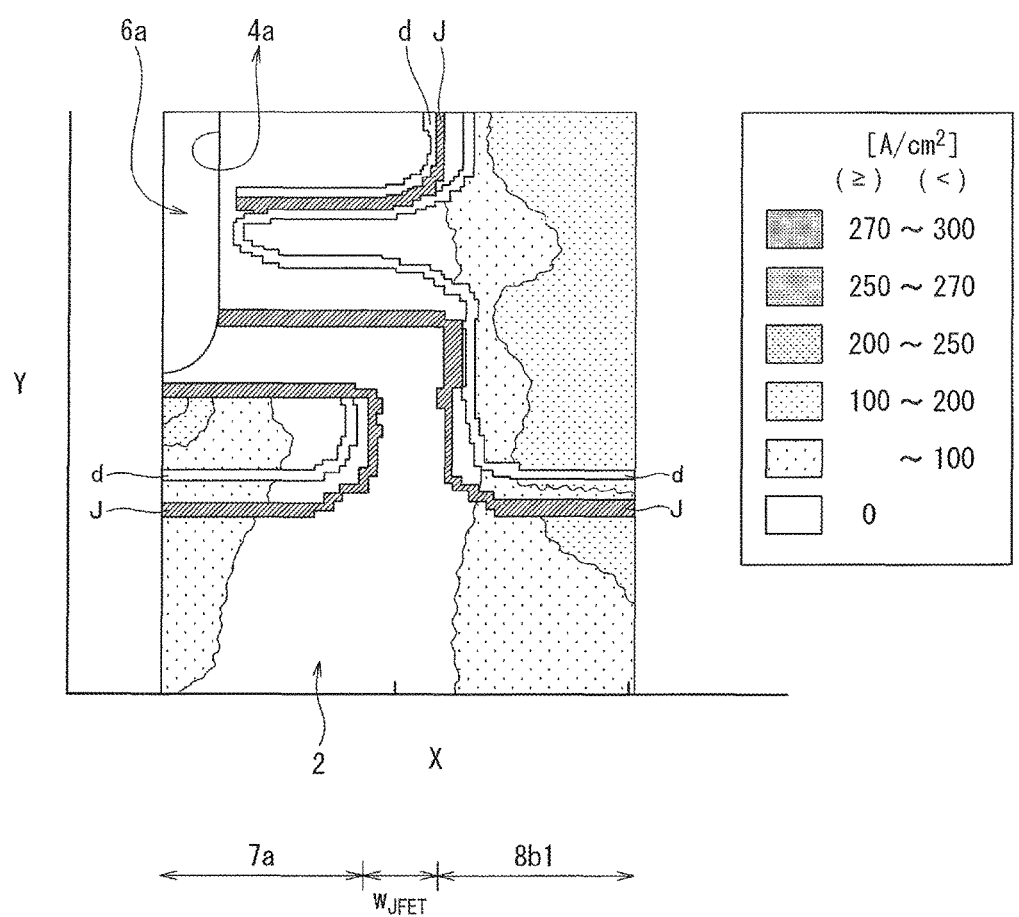
FIG. 9 schematically illustrates current distribution within the SiC semiconductor device in case No. 7 in FIG. 2.
Figure 10:
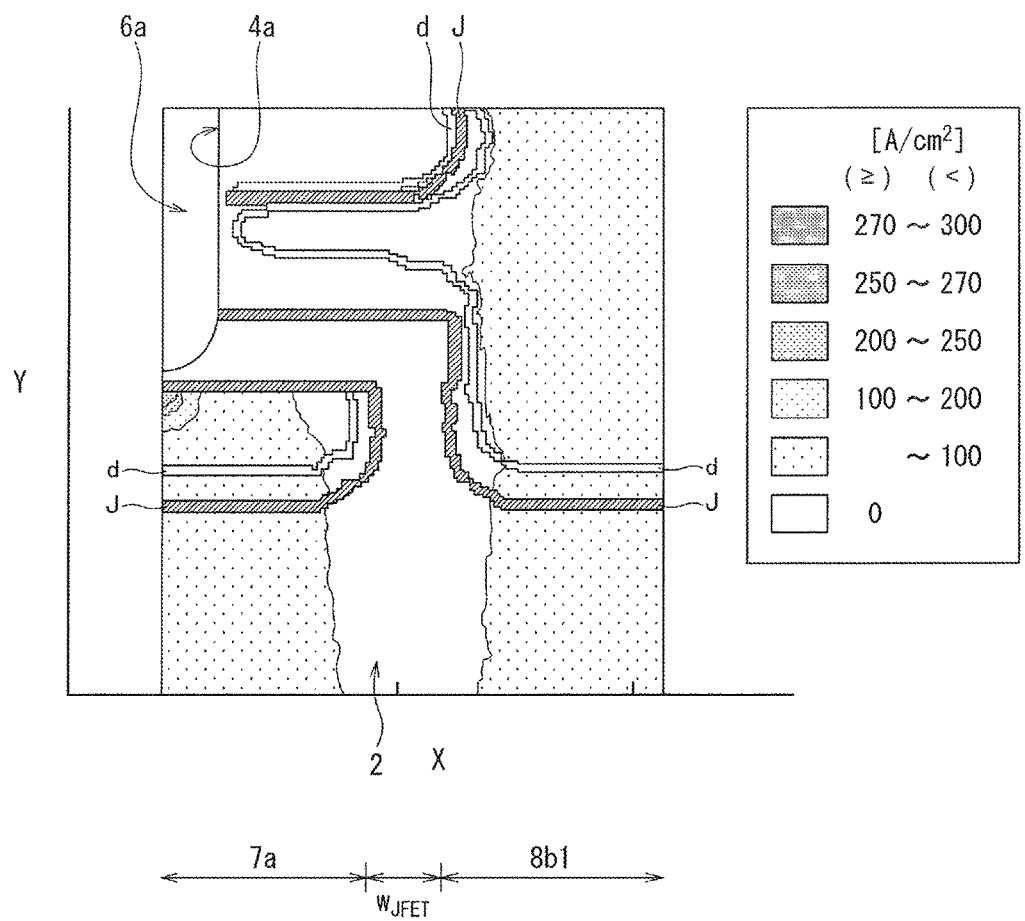
FIG. 10 schematically illustrates current distribution within the SiC semiconductor device in case No. 8 in FIG. 2.

Next, when the width ratio ($w_{tb}/w_{cb}$) is further reduced, as in No. 6 as illustrated in FIG. 8 in which the width ratio ($w_{tb}/w_{cb}$) is 4/3 and in No. 7 as illustrated in FIG. 9 in which the width ratio ($w_{tb}/w_{cb}$) is approximately 1.14, a small current flows beneath the trench 4a. Moreover, as illustrated in FIG. 10, when the width ratio ($w_{tb}/w_{cb}$) is 1 as in No. 8, currents of approximately the same magnitude that also exhibit a substantially left-right symmetric distribution flow both beneath the trench 4a and beneath the first under-contact base region 8b1.

Figure 11:
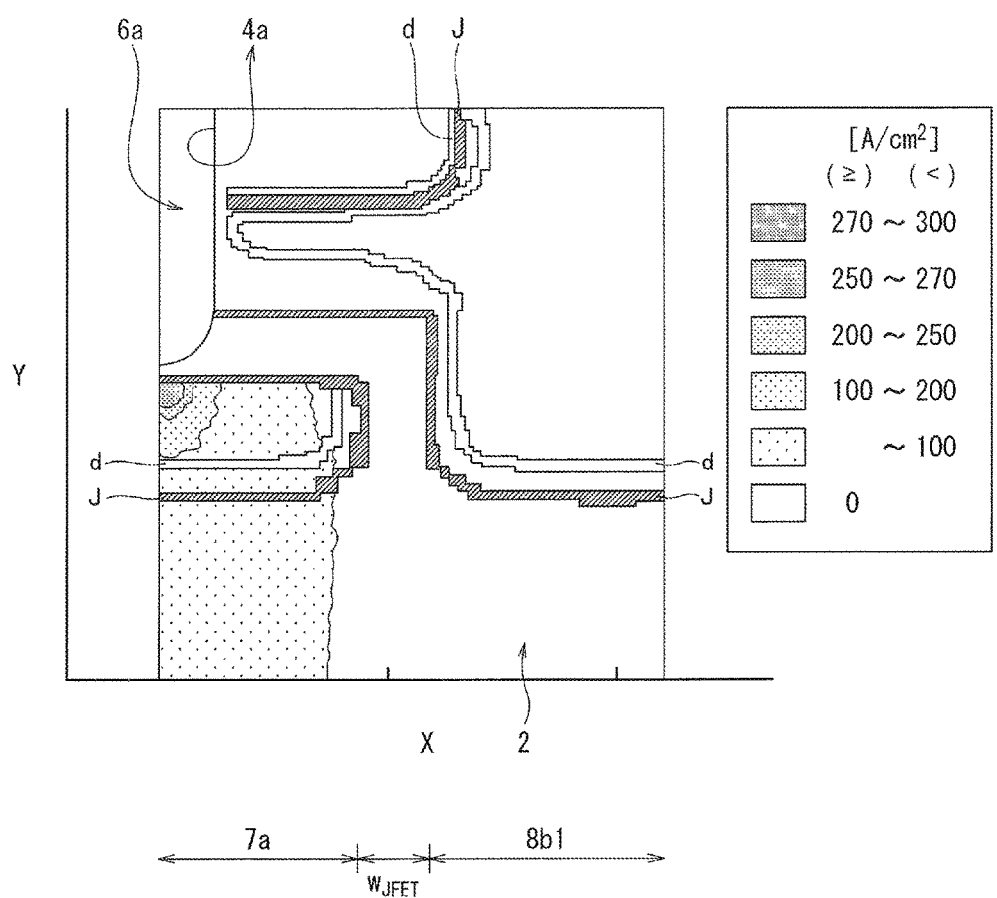
FIG. 11 schematically illustrates current distribution within the SiC semiconductor device in case No. 9 in FIG. 2.
Figure 12:
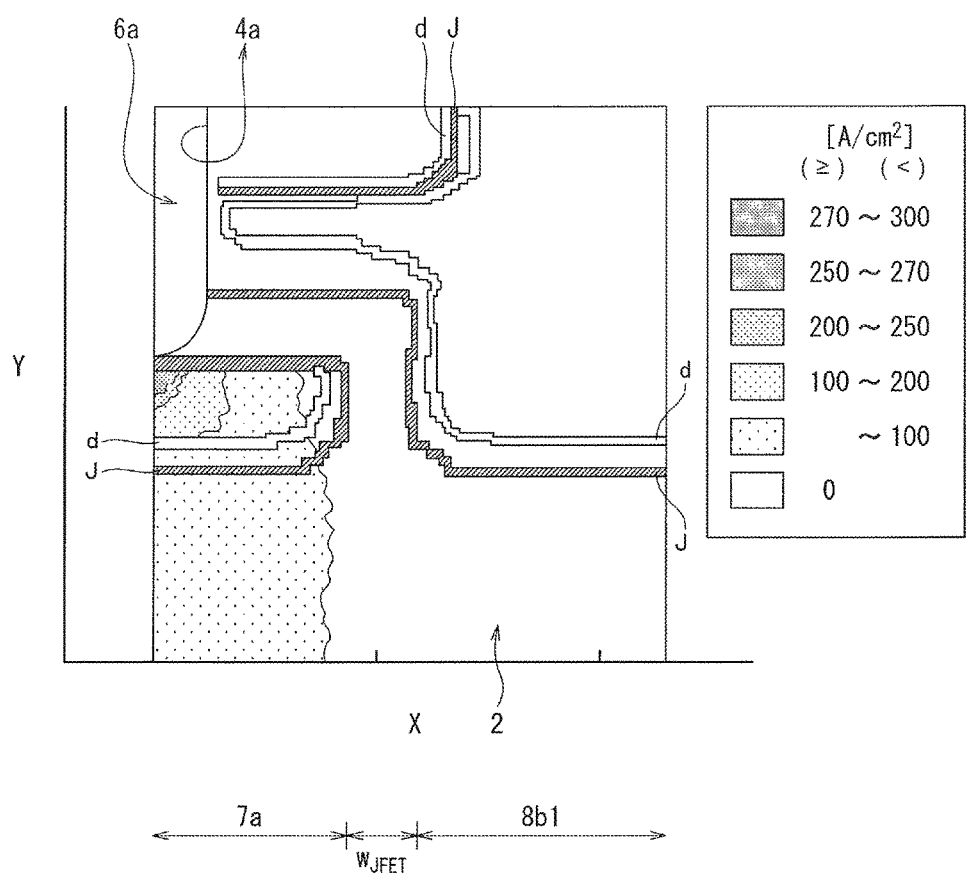
FIG. 12 schematically illustrates current distribution within the SiC semiconductor device in case No. 10 in FIG. 2.
Figure 13:
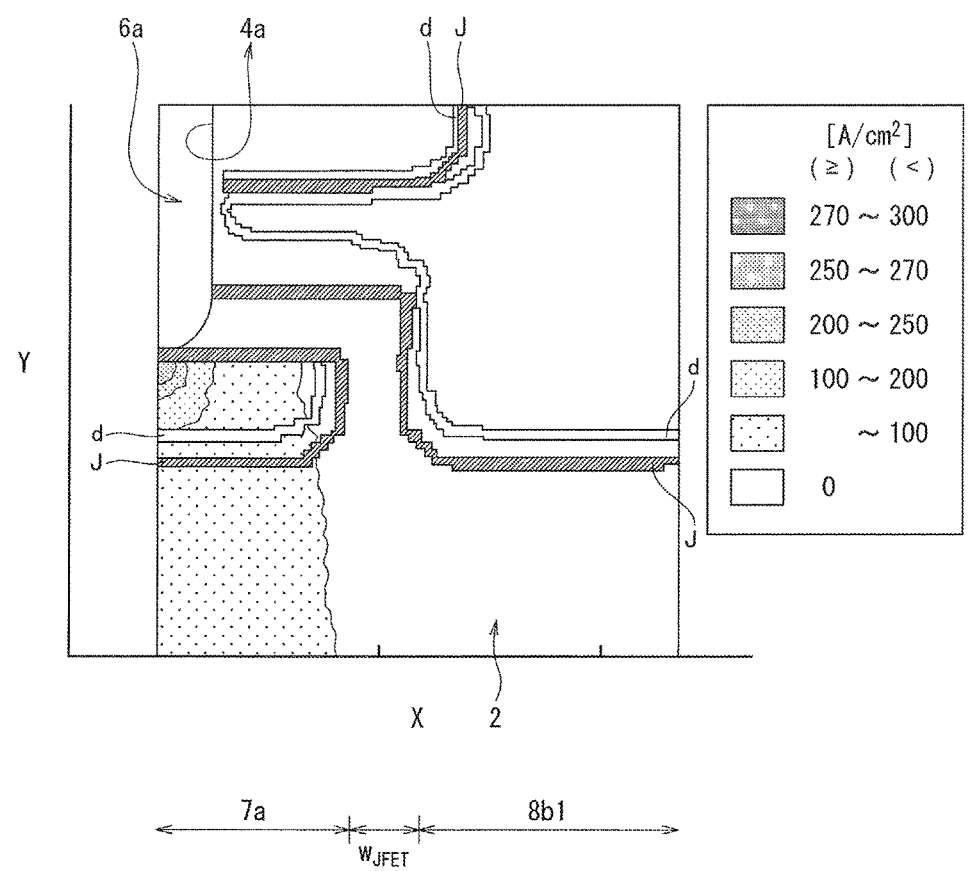
FIG. 13 schematically illustrates current distribution within the SiC semiconductor device in case No. 11 in FIG. 2.

Furthermore, as illustrated in FIG. 11, when the width ratio ($w_{tb}/w_{cb}$) is approximately 0.89 as in No. 9, the current flowing beneath the trench 4a increases in magnitude, and current no longer flows beneath the first under-contact base region 8b1. Finally, as illustrated in FIGS. 12 and 13, when the width ratio ($w_{tb}/w_{cb}$) is reduced even further, application of a reverse bias only causes current to flow beneath the trench 4a, and no current whatsoever flows beneath the first under-contact base region 8b1.

In the SiC semiconductor device according to the embodiment of the present invention, based on the experimental results presented in FIGS. 2 to 13, the width $w_{cb}$ of the first under-contact base regions 8a1, 8b1 and 8c1 and the width $w_{tb}$ of the protection regions 7a and 7b beneath the trenches 4a and 4b are set to specific values such that the width $w_{cb}$ satisfies the relationship $w_{tb}/w_{cb} > 4/3$ relative to the width $w_{tb}$. Controlling the width $w_{cb}$ and the width $w_{tb}$ to satisfy this numerical range proactively induces avalanche breakdown to occur in a manner in which the resulting avalanche current flows on the first under-contact base region 8a1, 8b1 and 8c1 sides. This makes it possible to reliably avoid the flow of avalanche current into the bottom sides of the trenches 4a and 4b if a reverse bias is applied at OFF time of the SiC semiconductor device.

In SiC semiconductor devices in particular, the voltages applied to the gate insulating films 5a and 5b can be extremely large. Therefore, forming the protection regions 7a and 7b and the first under-contact base regions 8a1, 8b1 and 8c1 at the same depths and having the same impurity concentrations has an extremely significant effect in terms of making it possible to reliably prevent breakdown of the gate insulating films 5a and 5b at the bottoms of the trenches 4a and 4b. Note that in the present specification, "at the same depths" means including a positional error tolerance of ±0.1 m or less, and "having the same impurity concentrations" means including an impurity error tolerance of ±1.0×10$^{18}$ cm$^{-3}$ to 1.0×10$^{19}$ cm$^{-3}$, inclusive.

Moreover, as shown in FIG. 2, in the SiC semiconductor device according to the embodiment of the present invention, the width $w_{tb}$ of the protection regions 7a and 7b beneath the trenches 4a and 4b and the width $w_{cb}$ of the first under-contact base regions 8a1, 8b1 and 8c1 further satisfy formula (2) below.

$$w_{tb} - 0.4 \text{ μm} > w_{cb} \qquad (2)$$

In other words, the width $w_{cb}$ of the first under-contact base regions 8a1, 8b1 and 8c1 is set to be shorter than the $w_{tb}$ of the protection regions 7a and 7b so that the width difference ($w_{tb} - w_{cb}$) is greater than 0.4 μm. As shown by the experimental results for No. 1 to No. 5 in FIG. 2, satisfying the relationship given by formula (2) makes it possible to ensure that no current whatsoever flows beneath the trenches 4a and 4b, thereby making it possible to further enhance the protection of the gate insulating films 5a and 5b at the bottoms of the of the trenches 4a and 4b.

Moreover, as illustrated in FIG. 1, the cross-sectional shape of the protection regions 7a and 7b of the SiC semiconductor device according to the embodiment of the present invention is sharply angled such that the lower edges on the left and right sides all have higher curvature than the lower edges on both sides of the first under-contact base regions 8a1, 8b1 and 8c1. This makes it easier for avalanche current to flow on the first under-contact base region 8a1, 8b1 and 8c1 sides, thereby making it possible to further enhance the protection of the gate insulating films 5a and 5b.

OTHER EMBODIMENTS

Although the present invention was described with reference to the embodiment above, the descriptions and drawings of this disclosure should not be understood to limit the present invention in any way. It should instead be understood that various alternative embodiments, examples, and applied technologies based on this disclosure would be obvious to a person skilled in the art. For example, the respective dimensions and impurity concentrations of the protection regions 7a and 7b and the first under-contact base regions 8a1, 8b1 and 8c1 as given in the description of the SiC semiconductor device according to the embodiment of the present invention are all only examples and may be modified as appropriate in accordance with the desired device specifications. Moreover, although the embodiment of the present invention was described as satisfying both formula (1) and formula (2) above as an example, the present invention may be configured to only satisfy formula (1) or may be configured to only satisfy formula (2).

Furthermore, although in the SiC semiconductor device according to the embodiment of the present invention the protection regions 7a and 7b have a cross-sectional shape in which the lower left and right edges have higher curvature than lower left and right edges of the first under-contact base regions 8a1, 8b1 and 8c1, for example, the present invention is not limited to this configuration. The cross-sectional shape of the protection regions 7a and 7b can be modified as appropriate as long as the width $w_{tb}$ of the protection regions 7a and 7b and the width $w_{cb}$ of the first under-contact base regions 8a1, 8b1 and 8c1 are controlled so as to make it possible to prevent flow of avalanche current into the bottom sides of the trenches 4a and 4b. Moreover, the positions with lower curvature do not necessarily have to be present on both sides, and the effects of the present invention can still be achieved even if only one side has low curvature, for example.

In addition, the charge accumulation layer 2 illustrated in FIG. 1 is not necessarily required, and the effects of the present invention can still be achieved even if the protection regions 7a and 7b and the first under-contact base regions 8a1, 8b1 and 8c1 are arranged within the drift region 1, for example. As described above, the present invention includes various other embodiments and the like that are not explicitly described above. Furthermore, the technical scope of the present invention is defined only by the characterizing features of the invention according to the claims, which are derived as appropriate from the descriptions above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A silicon carbide semiconductor device, comprising:
   a drift region made of silicon carbide of a first conductivity type;
   a base region made of silicon carbide of a second conductivity type, formed above the drift region;
   a first contact semiconductor region made of silicon carbide of the first conductivity type formed in an upper portion of the base region;
   a second contact semiconductor region made of silicon carbide of the first conductivity type formed on a bottom of the drift region;
   a trench gate structure having a trench penetrating the first contact semiconductor region and the base region and extending towards the drift region, the trench gate structure further having a gate insulating film formed inside the trench and a gate electrode filling in the trench with the gate insulating film interposed therebetween;
   a protection region made of silicon carbide of the second conductivity type formed adjacent to and beneath a bottom of the trench; and
   an avalanche breakdown-inducing region made of silicon carbide of the second conductivity type that is formed beneath the base region at a same depth as the protection region and has a same impurity concentration as the protection region,
   wherein a width $w_{cb}$ of the avalanche breakdown-inducing region and a width $w_{tb}$ of the protection region satisfy $w_{tb}/w_{cb} > 4/3$.

2. A silicon carbide semiconductor device, comprising:
   a drift region made of silicon carbide of a first conductivity type;
   a base region made of silicon carbide of a second conductivity type, formed above the drift region;
   a first contact semiconductor region made of silicon carbide of the first conductivity type formed in an upper portion of the base region;

a second contact semiconductor region made of silicon carbide of the first conductivity type formed on a bottom of the drift region;

a trench gate structure having a trench penetrating the first contact semiconductor region and the base region and extending towards the drift region, the trench gate structure further having a gate insulating film formed inside the trench and a gate electrode filling in the trench with the gate insulating film interposed therebetween;

a protection region made of silicon carbide of the second conductivity type formed adjacent to and beneath a bottom of the trench; and an avalanche breakdown-inducing region made of silicon carbide of the second conductivity type that is formed beneath the base region at a same depth as the protection region and has a same impurity concentration as the protection region, wherein a width $w_{cb}$ of the avalanche breakdown-inducing region and a width $w_{tb}$ of the protection region satisfy $w_{tb} - 0.4 \,\mu m > w_{cb}$.

3. The silicon carbide semiconductor device according to claim 1, wherein the width $w_{cb}$ of the avalanche breakdown-inducing region and the width $w_{tb}$ of the protection region further satisfy $w_{tb} - 0.4 \,\mu m > w_{cb}$.

4. The silicon carbide semiconductor device according to claim 1, wherein a lower edge of the avalanche breakdown-inducing region has a lower curvature than a lower edge of the protection region.

5. The silicon carbide semiconductor device according to claim 2, wherein a lower edge of the avalanche breakdown-inducing region has a lower curvature than a lower edge of the protection region.

6. The silicon carbide semiconductor device according to claim 3, wherein a lower edge of the avalanche breakdown-inducing region has a lower curvature than a lower edge of the protection region.

7. The silicon carbide semiconductor device according to claim 1,
wherein the base region is in contact with the drift region thereunder, and the trench reaches the drift region, and
wherein the protection region and the avalanche breakdown-inducing region are formed inside the drift region.

8. The silicon carbide semiconductor device according to claim 2,
wherein the base region is in contact with the drift region thereunder, and the trench reaches the drift region, and
wherein the protection region and the avalanche breakdown-inducing region are formed inside the drift region.

9. The silicon carbide semiconductor device according to claim 3,
wherein the base region is in contact with the drift region thereunder, and the trench reaches the drift region, and
wherein the protection region and the avalanche breakdown-inducing region are formed inside the drift region.

10. The silicon carbide semiconductor device according to claim 1, further comprising a charge accumulation layer made of silicon carbide of the first conductivity type between the base region and the drift region,
wherein the trench reaches the charge accumulation layer, and
wherein the protection region and the avalanche breakdown-inducing region are formed inside the charge accumulation layer.

11. The silicon carbide semiconductor device according to claim 2, further comprising a charge accumulation layer made of silicon carbide of the first conductivity type between the base region and the drift region,
wherein the trench reaches the charge accumulation layer, and
wherein the protection region and the avalanche breakdown-inducing region are formed inside the charge accumulation layer.

12. The silicon carbide semiconductor device according to claim 3, further comprising a charge accumulation layer made of silicon carbide of the first conductivity type between the base region and the drift region,
wherein the trench reaches the charge accumulation layer, and
wherein the protection region and the avalanche breakdown-inducing region are formed inside the charge accumulation layer.

* * * * *

UNITED STATES PATENT AND TRADEMARK OFFICE
CERTIFICATE OF CORRECTION

PATENT NO. : 10,164,021 B2
APPLICATION NO. : 15/947546
DATED : December 25, 2018
INVENTOR(S) : Kenji Okumura Page 1 of 1

It is certified that error appears in the above-identified patent and that said Letters Patent is hereby corrected as shown below:

In the Specification

Column 4, Line 21, the text "approximately 2.5 m" should be changed to -- approximately 2.5 µm --.

Column 4, Line 24, the text "approximately 1.2 m" should be changed to -- approximately 1.2 µm --.

Column 4, Line 31, the text "approximately 1.3 m" should be changed to -- approximately 1.3 µm --.

Column 5, Line 16, the text "approximately 0.2 am" should be changed to -- approximately 0.2 µm --.

Column 5, Line 41, the text "approximately 0.5 jam" should be changed to -- approximately 0.5 µm --.

Column 5, Line 41, the text "approximately 1.0 jam" should be changed to -- approximately 1.0 µm --.

Column 6, Line 24, the text "approximately 0.5 jam" should be changed to -- approximately 0.5 µm --.

Column 7, Line 35, the text "approximately 0.77 m" should be changed to -- approximately 0.77 µm --.

Column 7, Line 36, the text "approximately 1.36 m" should be changed to -- approximately 1.36 µm --.

Column 7, Line 41, the text "approximately 1.87 m" should be changed to -- approximately 1.87 µm --.

Column 9, Line 6, the text "tolerance of ±0.1 m" should be changed to -- tolerance of ±0.1 µm --.

Signed and Sealed this
Fifth Day of February, 2019

Andrei Iancu
*Director of the United States Patent and Trademark Office*